(12) United States Patent
Gruner et al.

(10) Patent No.: US 9,490,847 B2
(45) Date of Patent: *Nov. 8, 2016

(54) ERROR DETECTION AND CORRECTION FOR EXTERNAL DRAM

(71) Applicant: NVIDIA CORPORATION, Santa Clara, CA (US)

(72) Inventors: Fred Gruner, Brea, CA (US); Shane Keil, Santa Clara, CA (US); John S. Montrym, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 276 days.

This patent is subject to a terminal disclaimer.

(21) Appl. No.: 13/660,737

(22) Filed: Oct. 25, 2012

(65) Prior Publication Data

US 2013/0117631 A1 May 9, 2013

Related U.S. Application Data

(63) Continuation of application No. 12/568,639, filed on Sep. 28, 2009, now Pat. No. 8,301,980.

(51) Int. Cl.
*G11C 29/00* (2006.01)
*H03M 13/13* (2006.01)
*G06F 11/10* (2006.01)
*H03M 13/00* (2006.01)

(52) U.S. Cl.
CPC .......... *H03M 13/13* (2013.01); *G06F 11/1008* (2013.01); *H03M 13/6505* (2013.01); *H03M 13/6561* (2013.01); *H03M 13/6566* (2013.01)

(58) Field of Classification Search
CPC ............. G06F 11/1008; G06F 11/106; G06F 11/1068; G06F 12/0246; H03M 13/13
USPC ........................... 714/763, 769, 764, 758, 52
See application file for complete search history.

(56) References Cited

U.S. PATENT DOCUMENTS

| | | | | |
|---|---|---|---|---|
| 6,353,910 | B1* | 3/2002 | Carnevale et al. | 714/763 |
| 7,809,994 | B2* | 10/2010 | Gorobets | 714/52 |
| 7,900,120 | B2* | 3/2011 | Pawlowski et al. | 714/764 |
| 8,301,980 | B2* | 10/2012 | Gruner | G06F 11/1008 |
| | | | | 714/758 |

(Continued)

FOREIGN PATENT DOCUMENTS

CN 1971736 A 5/2007

OTHER PUBLICATIONS

International Search Report for PCT/US2010/050365, dated Apr. 25, 2014.

(Continued)

*Primary Examiner* — David Ton
(74) *Attorney, Agent, or Firm* — Artegis Law Group, LLP

(57) ABSTRACT

One embodiment of the present invention sets forth a technique for protecting data with an error correction code (ECC). The data is accessed by a processing unit and stored in an external memory, such as dynamic random access memory (DRAM). Application data and related ECC data are advantageously stored in a common page within a common DRAM device. Application data and ECC data are transmitted between the processor and the external common DRAM device over a common set of input/output (I/O) pins. Eliminating I/O pins and DRAM devices conventionally associated with transmitting and storing ECC data advantageously reduces system complexity and cost.

20 Claims, 16 Drawing Sheets

(56) References Cited

U.S. PATENT DOCUMENTS

| | | |
|---|---|---|
| 2005/0268180 A1* | 12/2005 | Sakagami ............... 714/701 |
| 2006/0277388 A1* | 12/2006 | Paley et al. ............. 711/173 |
| 2007/0214403 A1 | 9/2007 | Longwell et al. |
| 2007/0234182 A1 | 10/2007 | Wickeraad et al. |
| 2007/0271494 A1 | 11/2007 | Gorobets |
| 2007/0300130 A1* | 12/2007 | Gorobets ................. 714/766 |
| 2009/0235113 A1* | 9/2009 | Shaeffer et al. ............ 714/5 |

OTHER PUBLICATIONS

Extended European Search Report for Application No. 10819591.8 dated May 6, 2014.

* cited by examiner

US 9,490,847 B2

ERROR DETECTION AND CORRECTION FOR EXTERNAL DRAM

CROSS-REFERENCE TO RELATED APPLICATIONS

This application is a continuation of U.S. Pat. No. 8,301,980 entitled "ERROR DETECTION AND CORRECTION FOR EXTERNAL DRAM", Ser. No. 12/568,639, filed Sep. 28, 2009, hereby incorporated herein by reference.

BACKGROUND OF THE INVENTION

Field of the Invention

The present invention generally relates to error detection and correction in memory systems and more specifically to error detection and correction for external dynamic random access memory (DRAM).

Description of the Related Art

Certain processing units include a plurality of multi-threaded processing cores that can be configured to perform high throughput, highly parallel computations. One example of a processing unit comprising multi-threaded processing cores is a graphics-processing unit (GPU). The GPU can be configured to execute graphics programs, which typically require very high computational throughput, on the multi-threaded processing cores to generate real-time graphics images. Because graphics programs and corresponding data sets for the graphics programs typically require a significant amount of memory, external memories, such as discrete DRAM chips, are conventionally attached to the GPU to provide additional storage. Each DRAM chip includes input/output (I/O) data pins and I/O control pins that are attached to the GPU via one or more sets of I/O pins on the GPU.

Many conventional applications for GPU processing, such as real-time three-dimensional graphics entertainment applications, do not require a high degree of computational integrity and therefore do not require hardware-assisted error detection and correction for data stored in external DRAM chips. For example, if one frame out of eighty-five frames generated in one second includes one erroneous pixel value due to a soft error in external DRAM, a user may not notice or care that the error occurred. However, certain applications that may significantly benefit from high-throughput multi-threaded processing capabilities provided by GPU devices do, in fact, require error detection and correction because these applications require correct results.

A conventional approach to implementing error detection and correction in a processing unit, such as a central processing unit (CPU), includes protecting each data transaction between the processing unit and DRAM memory with an error correction code (ECC). The ECC includes a set of protection bits that are added to corresponding data bits for each transaction. The values of the protection bits are computed based on the values of the data bits. To accommodate storage of the protection bits, a conventional ECC implementation requires additional I/O pins on the processing unit to transmit the protection bits and at least one additional DRAM chip to store the protection bits. When multiple, independent DRAM channels require ECC protection, at least one additional DRAM chip per channel is conventionally required to provide storage for the corresponding ECC protection bits. However, adding I/O pins and DRAM chips to a processing unit system in order to support ECC represents an unnecessary and potentially significant cost burden for many processing unit applications that do not require ECC support.

Accordingly, what is needed in the art is a system and method for enabling a GPU to support ECC protection of data in DRAM without conventional cost burdens associated with ECC protection.

SUMMARY OF THE INVENTION

One embodiment of the present invention sets forth a method for checking data stored in a memory unit for errors, where both the data and error correction code (ECC) data related to the data are stored in the memory unit. The method includes initializing a read list data structure corresponding to a page of data stored within the memory unit, and receiving one or more data read requests to access data from the page of data, where each of the one or more data read requests corresponds to a different data sector included in the page of data. For each of the one or more data read requests, the method further includes determining whether an ECC read request to access an ECC sector that is included in the page of data and associated with the data sector corresponding to the data read request is already included in the read list data structure. If the ECC read request is not already included, then the ECC read request is added to the read list data structure, and the data read request is added to the read list data structure after the ECC read request. If the ECC read request is already included, then the data read request is added to the read list data structure after the ECC read request. The method also includes transmitting the read list data structure to an arbitration unit to access from the memory unit the data sectors corresponding to the one or more data read requests and one or more ECC sectors associated with the data sectors.

One advantage of the present invention is that a common hardware configuration of the parallel processing subsystem 112 can operate in both ECC mode for higher computational integrity and non-ECC mode for higher performance, without conventional cost burdens associated with operating a processor system in ECC mode.

Various other embodiments of the invention are directed to other methods described herein, to a memory controller configured to implement the above method and other methods described herein, and to a computing device that includes such a memory controller.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
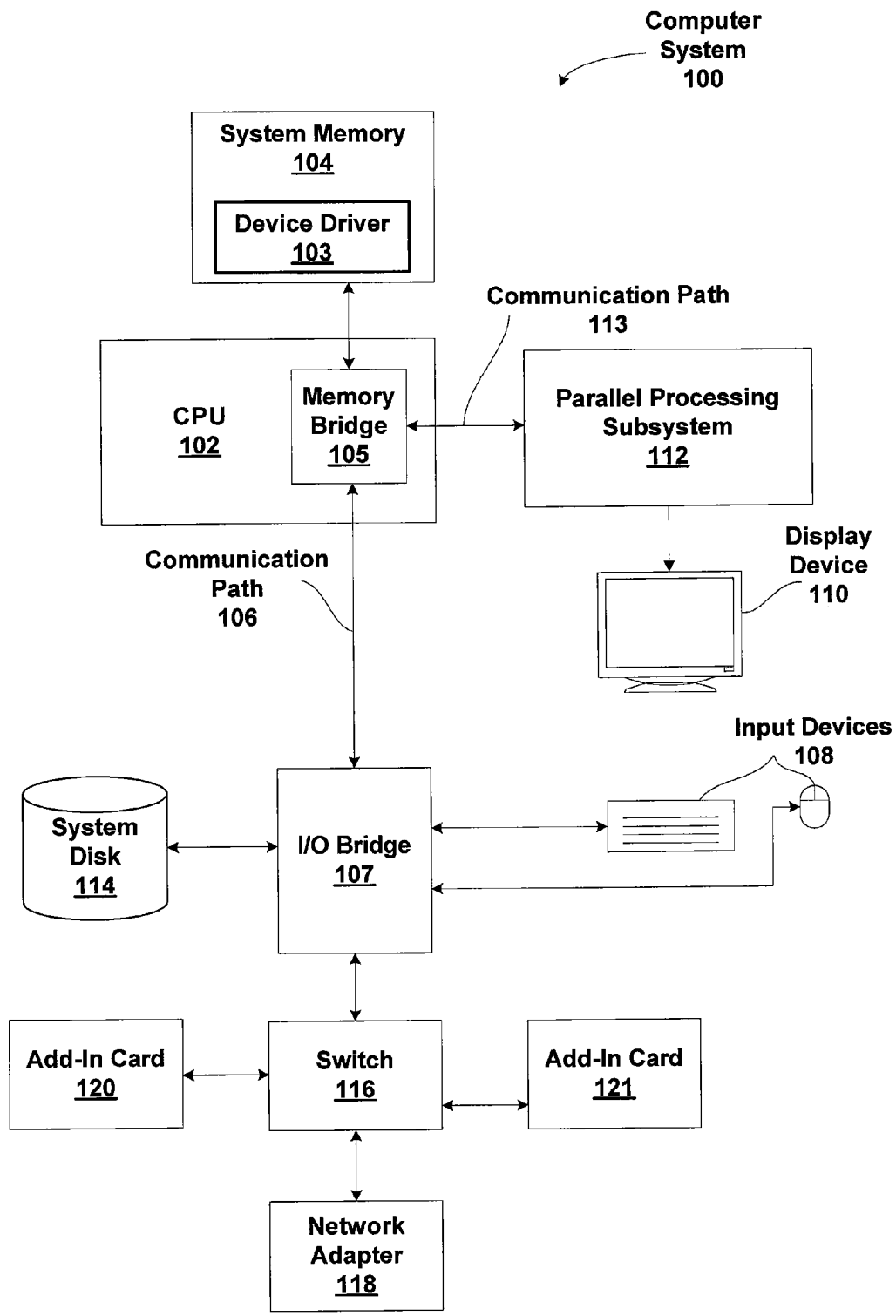
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 communicating via a bus path through a memory bridge 105. Memory bridge 105 may be integrated into CPU 102 as shown in FIG. 1. Alternatively, memory bridge 105, may be a conventional device, e.g., a Northbridge chip, that is connected via a bus to CPU 102. Memory bridge 105 is connected via communication path 106 (e.g., a HyperTransport link) to an I/O (input/output) bridge 107. I/O bridge 107, which may be, e.g., a Southbridge chip, receives user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a PCI Express, Accelerated Graphics Port, or HyperTransport link); in one embodiment parallel processing subsystem 112 is a graphics subsystem that delivers pixels to a display device 110 (e.g., a conventional CRT or LCD based monitor). A system disk 114 is also connected to I/O bridge 107. A switch 116 provides connections between I/O bridge 107 and other components such as a network adapter 118 and various add-in cards 120 and 121. Other components (not explicitly shown), including USB or other port connections, CD drives, DVD drives, film recording devices, and the like, may also be connected to I/O bridge 107. Communication paths interconnecting the various components in FIG. 1 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, one or more of CPU 102, I/O bridge 107, parallel processing subsystem 112, and memory bridge 105 may be integrated into one or more chips. The particular components shown herein are optional; for instance, any number of add-in cards or peripheral devices might be supported. In some embodiments, switch 116 is eliminated, and network adapter 118 and add-in cards 120, 121 connect directly to I/O bridge 107. In other embodiments display device 110 may be eliminated.

Figure 2:
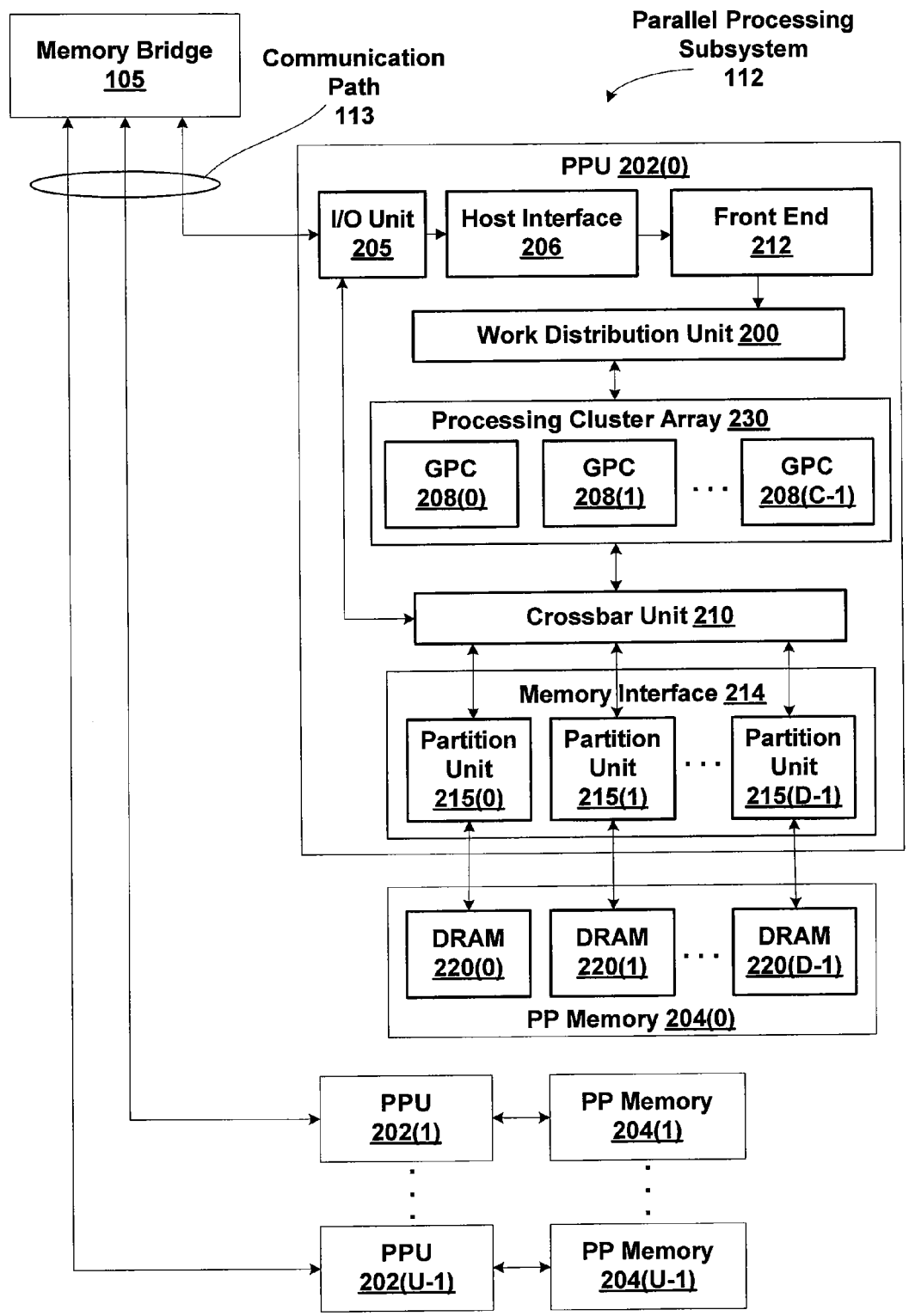
FIG. 2 is a block diagram of a parallel processing subsystem for the computer system of FIG. 1, according to one embodiment of the present invention.

FIG. 2 illustrates a parallel processing subsystem 112, according to one embodiment of the present invention. As shown, parallel processing subsystem 112 includes one or more parallel processing units (PPUs) 202, each of which is coupled to a local parallel processing (PP) memory 204. In general, a parallel processing subsystem includes a number U of PPUs, where U≥1. (Herein, multiple instances of like objects are denoted with reference numbers identifying the object and parenthetical numbers identifying the instance where needed.) PPUs 202 and parallel processing memories 204 may be implemented using one or more integrated circuit devices, such as programmable processors, application specific integrated circuits (ASICs), or memory devices, or in any other technically feasible fashion.

Referring again to FIG. 1, in some embodiments, some or all of PPUs 202 in parallel processing subsystem 112 are graphics processors with rendering pipelines that can be configured to perform various tasks related to generating pixel data from graphics data supplied by CPU 102 and/or system memory 104, interacting with local parallel processing memory 204 (which can be used as graphics memory including, e.g., a conventional frame buffer) to store and update pixel data, delivering pixel data to display device 110, and the like. In some embodiments, parallel processing subsystem 112 may include one or more PPUs 202 that operate as graphics processors and one or more other PPUs 202 that are used for general-purpose computations. The PPUs may be identical or different, and each PPU may have its own dedicated parallel processing memory device(s) or no dedicated parallel processing memory device(s). One or more PPUs 202 may output data to display device 110 or each PPU 202 may output data to one or more display devices 110.

In operation, CPU 102 is the master processor of computer system 100, controlling and coordinating operations of other system components. In particular, CPU 102 issues commands that control the operation of PPUs 202. In some embodiments, CPU 102 writes a stream of commands for each PPU 202 to a command buffer (not explicitly shown in either FIG. 1 or FIG. 2) that may be located in system memory 104, parallel processing memory 204, or another storage location accessible to both CPU 102 and PPU 202. PPU 202 reads the command stream from the command buffer and then executes commands asynchronously relative to the operation of CPU 102. CPU 102 may also create data buffers that PPUs 202 may read in response to commands in the command buffer. Each command and data buffer may be read by each of PPUs 202.

Referring back now to FIG. 2, each PPU 202 includes an I/O (input/output) unit 205 that communicates with the rest of computer system 100 via communication path 113, which connects to memory bridge 105 (or, in one alternative embodiment, directly to CPU 102). The connection of PPU 202 to the rest of computer system 100 may also be varied. In some embodiments, parallel processing subsystem 112 is implemented as an add-in card that can be inserted into an expansion slot of computer system 100. In other embodiments, a PPU 202 can be integrated on a single chip with a bus bridge, such as memory bridge 105 or I/O bridge 107. In still other embodiments, some or all elements of PPU 202 may be integrated on a single chip with CPU 102.

In one embodiment, communication path 113 is a PCI-Express link, in which dedicated lanes are allocated to each PPU 202, as is known in the art. Other communication paths may also be used. An I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to parallel processing memory 204) may be directed to a memory crossbar unit 210. Host interface 206 reads each command buffer and outputs the work specified by the command buffer to a front end 212.

Each PPU 202 advantageously implements a highly parallel processing architecture. As shown in detail, PPU 202(0) includes a processing cluster array 230 that includes a number C of general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. For example, in a graphics application, a first set of GPCs 208 may be allocated to perform tessellation operations and to produce primitive topologies for patches, and a second set of GPCs 208 may be allocated to perform tessellation shading to evaluate patch parameters for the primitive topologies and to determine vertex positions and other per-vertex attributes. The allocation of GPCs 208 may vary depending on the workload arising for each type of program or computation. Alternatively, GPCs 208 may be allocated to perform processing tasks using a time-slice scheme to switch between different processing tasks.

GPCs 208 receive processing tasks to be executed via a work distribution unit 200, which receives commands defining processing tasks from front end unit 212. Processing tasks include pointers to data to be processed, e.g., surface (patch) data, primitive data, vertex data, and/or pixel data, as well as state parameters and commands defining how the data is to be processed (e.g., what program is to be executed). Work distribution unit 200 may be configured to fetch the pointers corresponding to the processing tasks, may receive the pointers from front end 212, or may receive the data directly from front end 212. In some embodiments, indices specify the location of the data in an array. Front end 212 ensures that GPCs 208 are configured to a valid state before the processing specified by the command buffers is initiated.

When PPU 202 is used for graphics processing, for example, the processing workload for each patch is divided into approximately equal sized tasks to enable distribution of the tessellation processing to multiple GPCs 208. A work distribution unit 200 may be configured to output tasks at a frequency capable of providing tasks to multiple GPCs 208 for processing. In some embodiments of the present invention, portions of GPCs 208 are configured to perform different types of processing. For example a first portion may be configured to perform vertex shading and topology generation, a second portion may be configured to perform tessellation and geometry shading, and a third portion may be configured to perform pixel shading in screen space to produce a rendered image. The ability to allocate portions of GPCs 208 for performing different types of processing tasks efficiently accommodates any expansion and contraction of data produced by those different types of processing tasks. Intermediate data produced by GPCs 208 may be buffered to allow the intermediate data to be transmitted between GPCs 208 with minimal stalling in cases where the rate at which data is accepted by a downstream GPC 208 lags the rate at which data is produced by an upstream GPC 208.

Memory interface 214 may be partitioned into a number D of memory partition units that are each coupled to a portion of parallel processing memory 204, where D≥1. Each portion of parallel processing memory 204 generally includes one or more memory devices (e.g., DRAM 220). Persons skilled in the art will appreciate that DRAM 220 may be replaced with other suitable storage devices and can be of generally conventional design. A detailed description is therefore omitted. Render targets, such as frame buffers or texture maps may be stored across DRAMs 220, allowing partition units 215 to write portions of each render target in parallel to efficiently use the available bandwidth of parallel processing memory 204.

Any one of GPCs 208 may process data to be written to any of the DRAMs 220 within parallel processing memory 204. Crossbar unit 210 is configured to route the output of each GPC 208 to the input of any partition unit 215 or to another GPC 208 for further processing. GPCs 208 communicate with memory interface 214 through crossbar unit 210 to read from or write to various external memory devices. In one embodiment, crossbar unit 210 has a connection to memory interface 214 to communicate with I/O unit 205, as well as a connection to local parallel processing memory 204, thereby enabling the processing cores within the different GPCs 208 to communicate with system memory 104 or other memory that is not local to PPU 202. Crossbar unit 210 may use virtual channels to separate traffic streams between the GPCs 208 and partition units 215.

Again, GPCs 208 can be programmed to execute processing tasks relating to a wide variety of applications, including but not limited to, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel shader programs), and so on. PPUs 202 may transfer data from system memory 104 and/or local parallel processing memories 204 into internal (on-chip) memory, process the data, and write result data back to system memory 104 and/or local parallel processing memories 204, where such data can be accessed by other system components, including CPU 102 or another parallel processing subsystem 112.

A PPU 202 may be provided with any amount of local parallel processing memory 204, including no local memory, and may use local memory and system memory in any combination. For instance, a PPU 202 can be a graphics processor in a unified memory architecture (UMA) embodiment. In such embodiments, little or no dedicated graphics (parallel processing) memory would be provided, and PPU 202 would use system memory exclusively or almost exclusively. In UMA embodiments, a PPU 202 may be integrated into a bridge chip or processor chip or provided as a discrete chip with a high-speed link (e.g., PCI-Express) connecting the PPU 202 to system memory via a bridge chip or other communication means.

As noted above, any number of PPUs 202 can be included in a parallel processing subsystem 112. For instance, multiple PPUs 202 can be provided on a single add-in card, or multiple add-in cards can be connected to communication path 113, or one or more PPUs 202 can be integrated into a bridge chip. PPUs 202 in a multi-PPU system may be identical to or different from one another. For instance, different PPUs 202 might have different numbers of processing cores, different amounts of local parallel processing memory, and so on. Where multiple PPUs 202 are present, those PPUs may be operated in parallel to process data at a higher throughput than is possible with a single PPU 202. Systems incorporating one or more PPUs 202 may be implemented in a variety of configurations and form factors, including desktop, laptop, or handheld personal computers, servers, workstations, game consoles, embedded systems, and the like.

Processing Cluster Array Overview

Figure 3A:
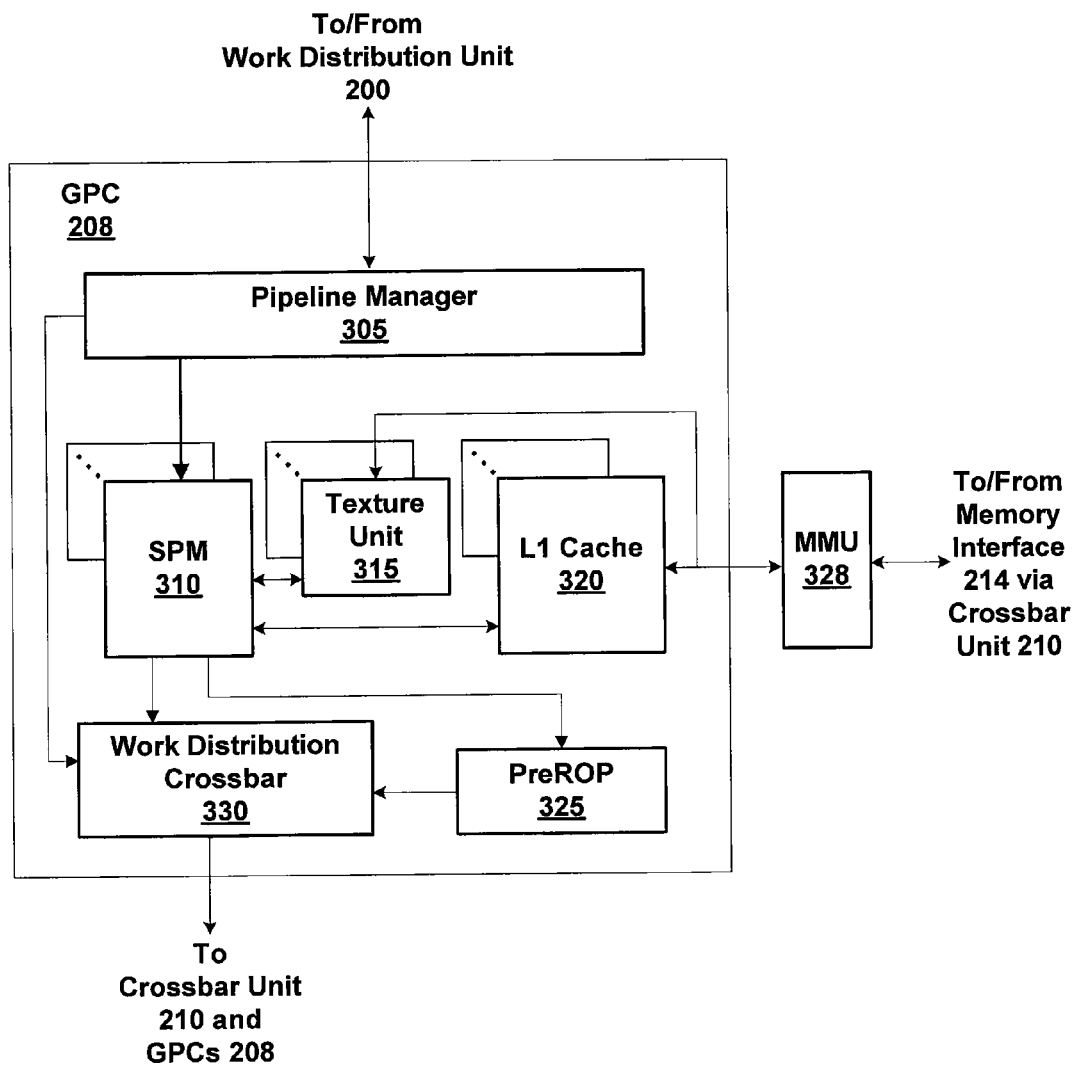
FIG. 3A is a block diagram of a GPC within one of the PPUs of FIG. 2, according to one embodiment of the present invention.

FIG. 3A is a block diagram of a GPC 208 within one of the PPUs 202 of FIG. 2, according to one embodiment of the present invention. Each GPC 208 may be configured to execute a large number of threads in parallel, where the term "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within each one of the GPCs 208. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

In graphics applications, a GPC 208 may be configured to implement a primitive engine for performing screen space graphics processing functions that may include, but are not limited to primitive setup, rasterization, and z culling. The primitive engine receives a processing task from work distribution unit 200, and when the processing task does not require the operations performed by primitive engine, the processing task is passed through the primitive engine to a pipeline manager 305. Operation of GPC 208 is advantageously controlled via a pipeline manager 305 that distributes processing tasks to streaming multiprocessors (SPMs) 310. Pipeline manager 305 may also be configured to control a work distribution crossbar 330 by specifying destinations for processed data output by SPMs 310.

In one embodiment, each GPC 208 includes a number M of SPMs 310, where M≥1, each SPM 310 configured to process one or more thread groups. The series of instructions transmitted to a particular GPC 208 constitutes a thread, as previously defined herein, and the collection of a certain number of concurrently executing threads across the parallel processing engines (not shown) within an SPM 310 is referred to herein as a "thread group." As used herein, a "thread group" refers to a group of threads concurrently executing the same program on different input data, with each thread of the group being assigned to a different processing engine within an SPM 310. A thread group may include fewer threads than the number of processing engines within the SPM 310, in which case some processing engines will be idle during cycles when that thread group is being processed. A thread group may also include more threads than the number of processing engines within the SPM 310, in which case processing will take place over multiple clock cycles. Since each SPM 310 can support up to G thread groups concurrently, it follows that up to G×M thread groups can be executing in GPC 208 at any given time.

Additionally, a plurality of related thread groups may be active (in different phases of execution) at the same time within an SPM 310. This collection of thread groups is referred to herein as a "cooperative thread array" ("CTA"). The size of a particular CTA is equal to m*k, where k is the number of concurrently executing threads in a thread group and is typically an integer multiple of the number of parallel processing engines within the SPM 310, and m is the number of thread groups simultaneously active within the SPM 310. The size of a CTA is generally determined by the programmer and the amount of hardware resources, such as memory or registers, available to the CTA.

An exclusive local address space is available to each thread, and a shared per-CTA address space is used to pass data between threads within a CTA. Data stored in the per-thread local address space and per-CTA address space is stored in L1 cache 320, and an eviction policy may be used to favor keeping the data in L1 cache 320. Each SPM 310 uses space in a corresponding L1 cache 320 that is used to perform load and store operations. Each SPM 310 also has access to L2 caches within the partition units 215 that are shared among all GPCs 208 and may be used to transfer data between threads. Finally, SPMs 310 also have access to off-chip "global" memory, which can include, e.g., parallel processing memory 204 and/or system memory 104. An L2 cache may be used to store data that is written to and read from global memory. It is to be understood that any memory external to PPU 202 may be used as global memory.

Also, each SPM 310 advantageously includes an identical set of functional units (e.g., arithmetic logic units, etc.) that may be pipelined, allowing a new instruction to be issued before a previous instruction has finished, as is known in the art. Any combination of functional units may be provided. In one embodiment, the functional units support a variety of operations including integer and floating point arithmetic (e.g., addition and multiplication), comparison operations, Boolean operations (AND, OR, XOR), bit-shifting, and computation of various algebraic functions (e.g., planar interpolation, trigonometric, exponential, and logarithmic functions, etc.); and the same functional-unit hardware can be leveraged to perform different operations.

Each GPC 208 may include a memory management unit (MMU) 328 that is configured to map virtual addresses into physical addresses. In other embodiments, MMU(s) 328 may reside within the memory interface 214. The MMU 328 includes a set of page table entries (PTEs) used to map a virtual address to a physical address of a tile and optionally a cache line index. The physical address is processed to distribute surface data access locality to allow efficient request interleaving among partition units. The cache line index may be used to determine whether or not a request for a cache line is a hit or miss.

In graphics applications, a GPC 208 may be configured such that each SPM 310 is coupled to a texture unit 315 for performing texture mapping operations, e.g., determining texture sample positions, reading texture data, and filtering the texture data. Texture data is read via memory interface 214 and is fetched from an L2 cache, parallel processing memory 204, or system memory 104, as needed. Texture unit 315 may be configured to store the texture data in an internal cache. In some embodiments, texture unit 315 is coupled to L1 cache 320, and texture data is stored in L1 cache 320. Each SPM 310 outputs processed tasks to work distribution crossbar 330 in order to provide the processed task to another GPC 208 for further processing or to store the processed task in an L2 cache, parallel processing memory 204, or system memory 104 via crossbar unit 210. A preROP (pre-raster operations) 325 is configured to receive data from SPM 310, direct data to ROP units within partition units 215, and perform optimizations for color blending, organize pixel color data, and perform address translations.

It will be appreciated that the core architecture described herein is illustrative and that variations and modifications are possible. Any number of processing engines, e.g., primitive engines, SPMs 310, texture units 315, or preROPs 325 may be included within a GPC 208. Further, while only one GPC 208 is shown, a PPU 202 may include any number of GPCs 208 that are advantageously functionally similar to one another so that execution behavior does not depend on which GPC 208 receives a particular processing task. Further, each GPC 208 advantageously operates independently of other GPCs 208 using separate and distinct processing engines, L1 caches 320, and so on.

Figure 3B:
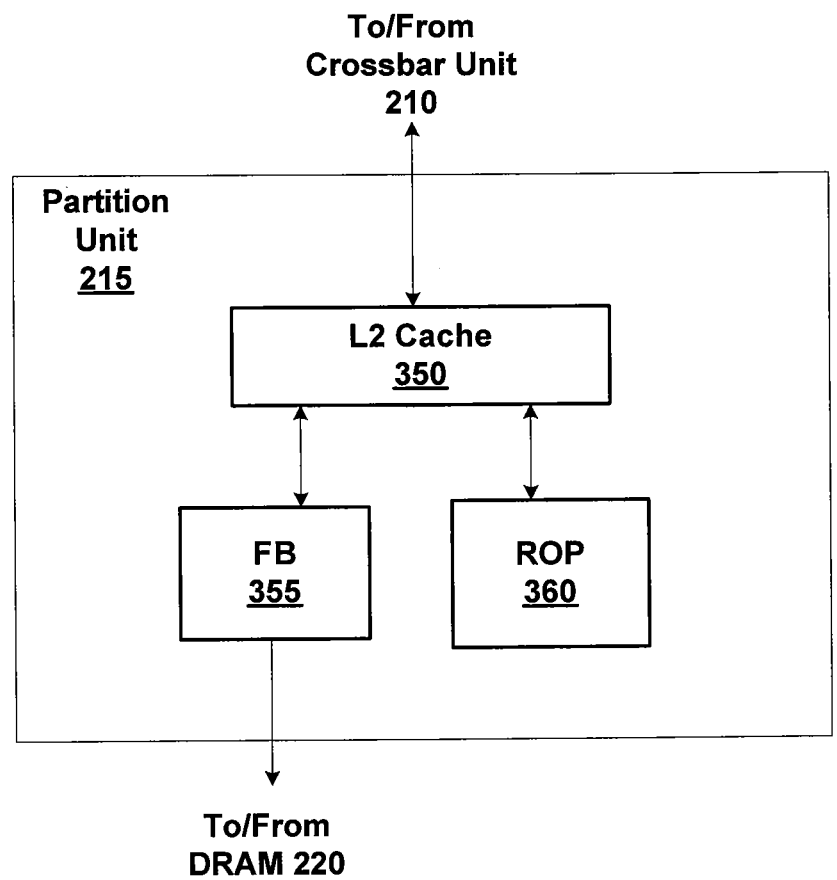
FIG. 3B is a block diagram of a partition unit within one of the PPUs of FIG. 2, according to one embodiment of the present invention.

FIG. 3B is a block diagram of a partition unit 215 within one of the PPUs 202 of FIG. 2, according to one embodiment of the present invention. As shown, partition unit 215 includes a L2 cache 350, a frame buffer (FB) 355, and a raster operations unit (ROP) 360. L2 cache 350 is a read/write cache that is configured to perform load and store operations received from crossbar unit 210 and ROP 360. Read misses and urgent writeback requests are output by L2 cache 350 to FB 355 for processing. Dirty updates are also sent to FB 355 for opportunistic processing. FB 355 interfaces directly with DRAM 220, outputting read and write requests and receiving data read from DRAM 220.

In graphics applications, ROP 360 is a processing unit that performs raster operations, such as stencil, z test, blending, and the like, and outputs pixel data as processed graphics data for storage in graphics memory. In some embodiments of the present invention, ROP 360 is included within each GPC 208 instead of partition unit 215, and pixel read and write requests are transmitted over crossbar unit 210 instead of pixel fragment data.

The processed graphics data may be displayed on display device 110 or routed for further processing by CPU 102 or by one of the processing entities within parallel processing subsystem 112. Each partition unit 215 includes a ROP 360 in order to distribute processing of the raster operations. In some embodiments, ROP 360 may be configured to compress z or color data that is written to memory and decompress z or color data that is read from memory.

Persons skilled in the art will understand that the architecture described in FIGS. 1, 2, 3A and 3B in no way limits the scope of the present invention and that the techniques taught herein may be implemented on any properly configured processing unit, including, without limitation, one or more CPUs, one or more multi-core CPUs, one or more PPUs 202, one or more GPCs 208, one or more graphics or special purpose processing units, or the like, without departing the scope of the present invention.

ECC Protection of Read Path to DRAM

Figure 4:
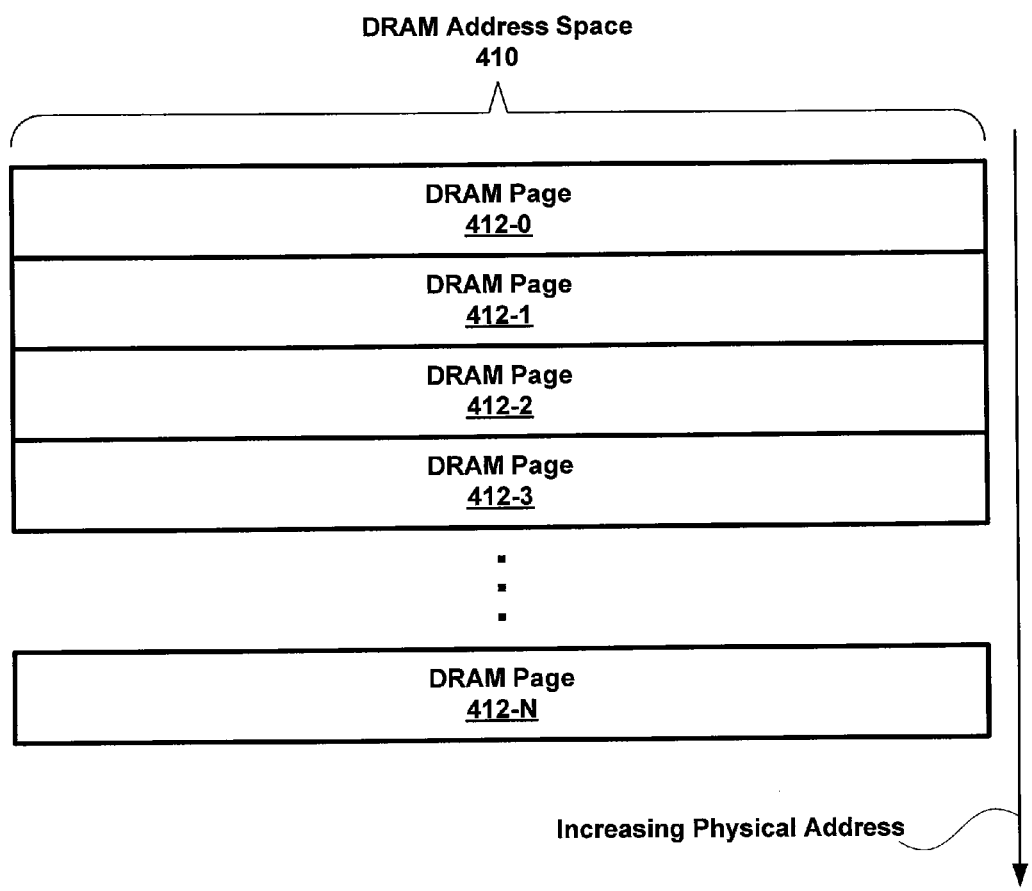
FIG. 4 illustrates an address space for a dynamic random access memory (DRAM) that is coupled to a partition unit, according to one embodiment of the present invention.

FIG. 4 illustrates an address space 410 for a dynamic random access memory (DRAM) 220 that is coupled to a partition unit 215, according to one embodiment of the present invention. The DRAM address space 410 comprises a plurality of DRAM pages 412 organized as an increasing physical address within the DRAM 220. A DRAM page 412 conventionally comprises either 1024 bytes ("1K bytes") or 2048 bytes ("2K bytes"). The DRAM address space 410 may be combined with one or more other DRAM address spaces coupled to other partition units 215 to form a larger overall address space that is accessible to the PPU 202.

While embodiments of the present invention discussed below in FIGS. 5A through 7C generally contemplate a DRAM page size of 1K bytes, other DRAM page sizes, such as 512 bytes or 2048 bytes, may be used without departing the scope of this invention.

Figure 5A:
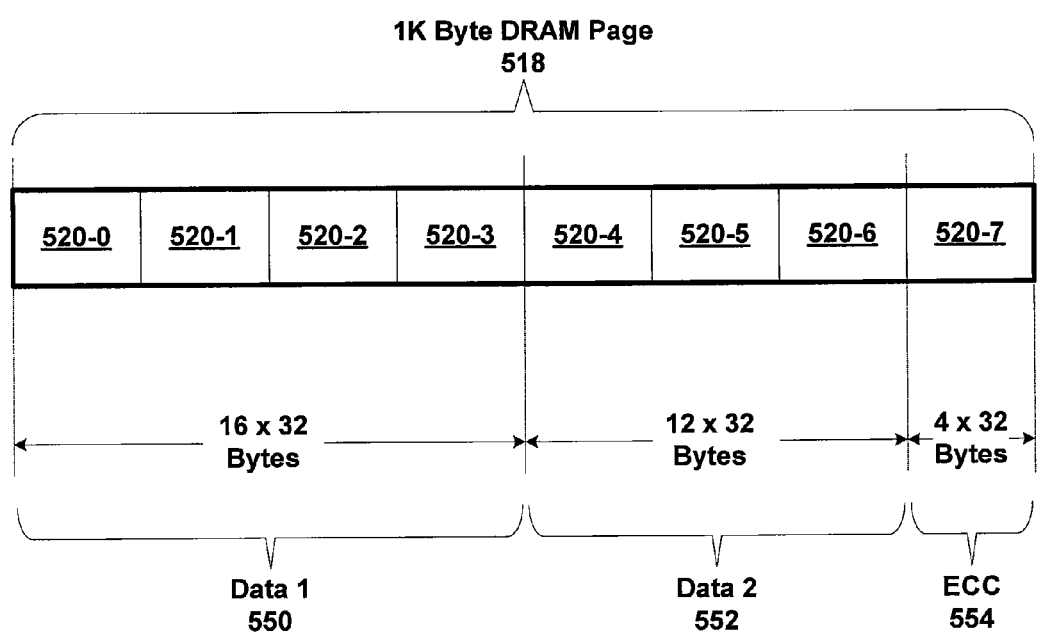
FIG. 5A illustrates one page of DRAM organized into a first set of data blocks, a second data set of data blocks, and error correction code (ECC) data stored in one block of data, according to one embodiment of the present invention.

FIG. 5A illustrates one page of DRAM 518 organized into a first set of data blocks (data 1) 550, a second data set of data blocks (data 2) 552, and error correction code (ECC) data 554 stored in one block 520-7 of data, according to one embodiment of the present invention. Each block 520 comprises one hundred twenty-eight bytes that are organized as four sectors of thirty-two bytes each. Data 1 550 comprises four blocks 520-0 to 520-3 organized as sixteen thirty-two byte sectors. Data 2 552 comprises three blocks 520-4 to 520-6 organized as twelve thirty-two byte sectors. ECC 554 comprises one block 520-7 organized four thirty-two byte sectors. Data 1 550 and data 2 552 comprise application data that is protected by ECC data 554. Each thirty-two byte sector may be associated with a cache line in the L2 cache 350 of FIG. 3B.

Persons skilled in the art will recognize that in an embodiment using a 2K byte DRAM page, one block of ECC data may be used to protect fifteen blocks of application data within a given page.

Figure 5B:
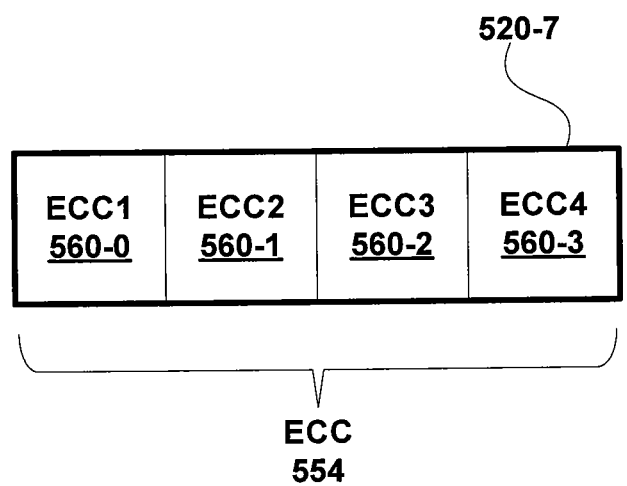
FIG. 5B illustrates the ECC data block within the one page of DRAM, organized into four thirty-two byte sectors of ECC data, according to one embodiment of the present invention.

FIG. 5B illustrates the ECC data block 520-7 within the one page of DRAM 518, organized into four thirty-two byte sectors 560-0 through 560-3 of ECC data 554, according to one embodiment of the present invention. In one embodiment, ECC data 554 is allocated to protect thirty-two byte increments of application data. That is, ECC data 554 is allocated to protect individual sectors within the DRAM page 518. A first sector of ECC data, ECC1 560-0 provides thirty-two bytes of ECC data that is used to protect sixteen thirty-two-byte sectors of application data. In other words, two bytes of ECC1 560-0 are used to protect thirty-two bytes of application data within data 1 550.

ECC2 560-1 is used to protect three hundred eighty-four bytes of application data. Two bytes of ECC2 560-1 data are used to protect thirty-two bytes of application data within data 2 552.

ECC3 560-2 and ECC4 560-3 may be unused for DRAM configurations that use 1K byte pages. For DRAM configurations that use 2K byte pages, ECC3 560-2 and ECC4 560-3 are used to protect application data in a ratio of two bytes of ECC data to thirty-two bytes of application data.

Figure 6A:
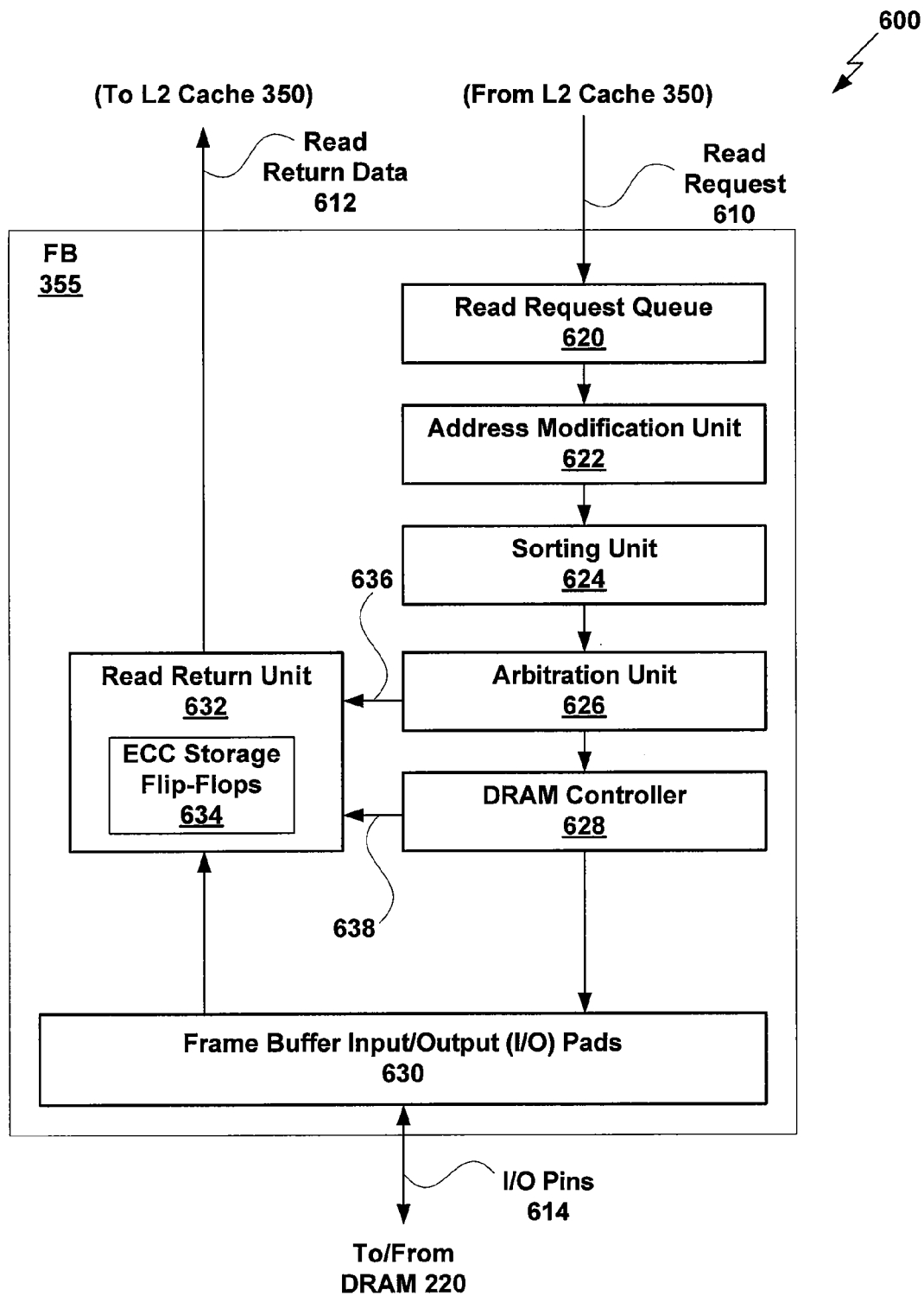
FIG. 6A is a block diagram of an ECC-protected read path from the L2 cache to the DRAM, according to one embodiment of the present invention.

FIG. 6A is a block diagram of an ECC-protected read path 600 from the L2 cache 350 to the DRAM 220, according to one embodiment of the present invention. The ECC-protected read path 600 resides within FB 355 (also referred to herein as the "memory controller") of FIG. 3B. The ECC-protected read path 600 receives read requests from the L2 cache 350 via a read request signal 610 and replies to the read requests via a read return data signal 612. I/O pins 614 connect the ECC-protected read path 600 to one or more DRAM chips 220.

The ECC-protected read path 600 comprises a read request queue 620, an address modification unit 622, a sorting unit 624, an arbitration unit 626, a DRAM controller 628, frame buffer I/O pads 630, and a read return unit 632. The read request queue 620 receives read requests and stores the read requests until the address modification unit 622 is ready to process the read requests. In one embodiment, the L2 cache 350 generates the read requests.

The address modification unit 622 multiplies a linear physical address associated with a read request to access a one hundred twenty eight byte sector by eight-sevenths ("⅛⁄₇") to generate an expanded physical address from the linear physical address. The linear physical address assumes a contiguous physical address space for application data, whereas the expanded physical address accommodates ECC data that is stored in-line with application data. In one embodiment, the ECC data is included at a rate of one sector of ECC data per seven sectors of application data. In an alternative embodiment, the address modification unit 622 multiplies the linear physical address by sixteen-fifteenths ("¹⁶⁄₁₅") to accommodate one block of one hundred twenty eight bytes of ECC data per fifteen blocks of application data in a DRAM with 2K byte pages. Programs executing in the PPU 202, which are unaware of the expanded physical address space or any in-line ECC data, generate read requests assuming a linear physical address space.

The sorting unit 624 coalesces read requests to a common DRAM page, such as DRAM page 518, such that coalesced read requests are executed sequentially once the common DRAM page has been opened, even if the read requests are received by the read request queue 620 in a different sequence. The sorting unit 624 builds a read list structure comprising at least one coalesced read request and transmits the read list structure to the arbitration unit 626 for processing. The sorting unit 624 may generate a plurality of read list structures simultaneously where each read list structure is associated with a different DRAM page. In one embodiment the sorting unit 624 supports simultaneously generating at least sixty different read list structures.

In one embodiment, the arbitration unit 626 instructs the sorting unit 624 when to close a given read list structure, allowing the closed read list structure to be executed. The arbitration unit 626 schedules sequential read requests based on the read list structure and transmits the sequential read requests to the read return unit 632 and the DRAM controller 628. Elements from the read list structure are transmitted to the read return unit 632 via read list data path 636 for execution by the read return unit 632. Alternatively, a complete read list structure may be transmitted to the read return unit 632 for execution. The DRAM controller 628 transmits protocol control signals 638 to read return unit 632 based on commands being transmitted to the DRAM 220. The protocol control signals 638 allow the read return unit 632 to operate according to proper DRAM control protocols, without requiring the read return unit 632 to have detailed device knowledge of each possible DRAM device that may be coupled to the FB 355. The read return unit 632 receives electrical signals from the frame buffer I/O pads 630 that represent data from the external DRAM devices 220.

Persons skilled in the art will recognize that reading at least one sector of ECC bytes upon opening each new DRAM page may be a performance burden. However, the read command latency associated with the ECC bytes may frequently be hidden by other commands needed by DRAM 220; as a result, the overall performance burden of reading ECC data in line with application data should be reduced.

The read return unit 632 receives data retrieved from DRAM devices 220 and transmits the data via read return data signal 612 to an associated requestor. In one embodiment, the L2 cache 350 is the requestor and the data is transmitted to the L2 cache 350. The read return unit 632 may buffer and optionally re-sequence data prior to transmitting the data to the L2 cache 350. The read return unit 632 includes data storage circuits, such as ECC storage flip-flops 634, which can locally store ECC data to protect application data stored in a DRAM page such as in DRAM page 518. In one embodiment, read return unit 632 comprises storage for ECC data sufficient to protect a 1K byte page of data stored in the DRAM 220. Fifty-six bytes of ECC data are needed to protect a 1K byte page, which includes eight hundred ninety-six (128×7) bytes of application data.

Figure 6B:
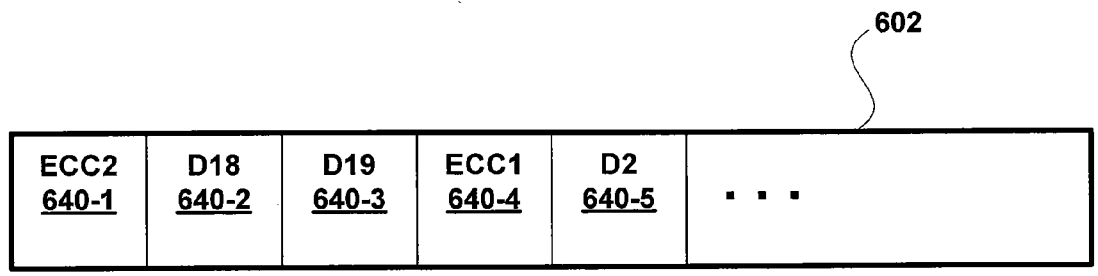
FIG. 6B illustrates a read list structure for organizing read requests to the DRAM, according to one embodiment of the present invention.

FIG. 6B illustrates a read list structure 602 for organizing read requests to the DRAM 220, according to one embodiment of the present invention. The read list structure 602 represents an ordered list of read requests to the same DRAM page generated by the L2 cache 350 and associated with cache lines that need to be filled by reading sectors from DRAM 220. In one embodiment, each cache line comprises thirty-two bytes that map directly onto a DRAM sector. Each read operation comprises an irreducible thirty-two byte transfer operation from DRAM 220.

In operation, a request to read application data within DRAM page 518 should always be preceded within the read list structure by a request to read a corresponding sector of ECC data within the DRAM page 518. Once the corresponding sector of ECC data is scheduled within the read list structure, read requests associated with other sectors within the DRAM page 518 follow within the read list structure without additional requests for the same ECC data. Specifically, after a given sector of ECC data is retrieved from DRAM 220 and stored within the read return unit 632, subsequently read sectors of application data associated with the sector of ECC data may be protected using the sector of ECC data already stored within the read return unit 632.

For example, if a sequence of requests comprises requests to sectors D18 and D19, associated with ECC2, followed by a request to sector D2, associated with ECC1, is posted by the L2 cache 350, read list structure 602 is generated. Read list structure 602 includes a request 640-1 to ECC2, followed by a request 640-2 to D18, a request 640-3 to D19, a request 640-4 to ECC1, and a request 640-5 to D2. The requests 640 are transmitted to DRAM 220 in sequence, with ECC data pre-loaded into the read return unit 632 prior to corresponding application data arriving at the read return unit 632 for processing.

If no errors are detected by the read return unit 632, then data retrieved from DRAM 220 is transmitted via the read return data signal 612 to the L2 cache 350. In one embodiment, if a one bit error is detected and corrected by the read return unit 632, then the L2 cache 350 is informed and a cache line of thirty-two bytes corresponding to a thirty-two byte sector with a single bit error is marked "dirty." A "dirty" cache line is written back to DRAM 220 by the L2 cache 350, for example upon cache line replacement. The cache line write back causes the corresponding sector of data in DRAM 220 with one bit error to be overwritten with a corrected version of the data. Each single bit error should be logged and reported to a host processor. In one embodiment, a syndrome of bit errors associated with a specific region of DRAM memory triggers a memory allocation function to avoid allocating the region. If a two bit error is detected by the read return unit 632, then the errors should be logged and reported. In one embodiment, two bit errors detected within a given sector trigger an alert to an application executing on a host processor, such as CPU 102. In one configuration, if the read return unit 632 detects two simultaneous bit errors then processing may be halted and application-level error mitigation is triggered.

Figure 6C:
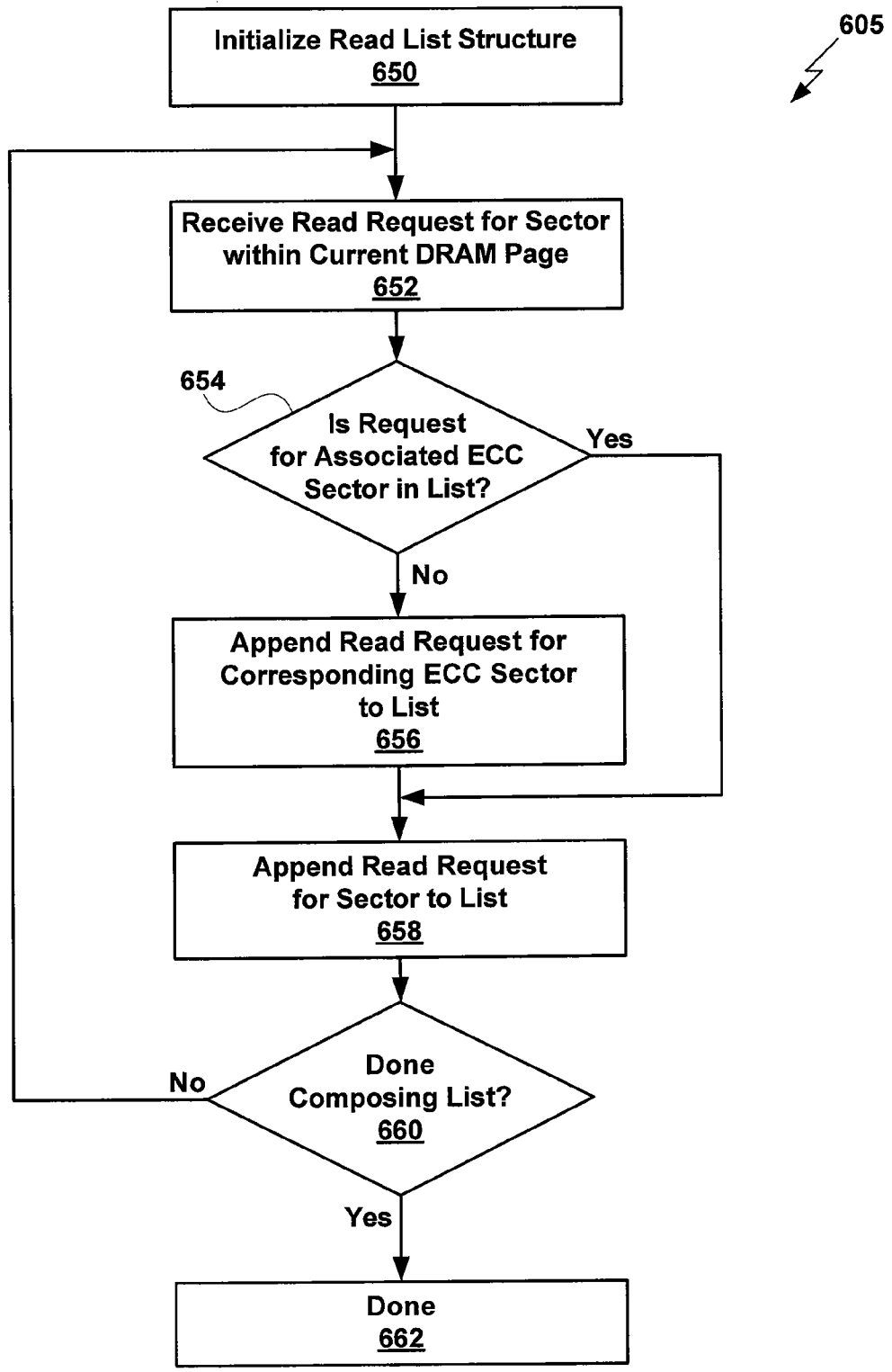
FIG. 6C is a flow diagram of method steps for composing the read list structure, according to one embodiment of the present invention.

FIG. 6C is a flow diagram of method steps 605 for composing the read list structure, according to one embodiment of the present invention. Although the method steps are described in conjunction with the systems of FIGS. 1-3B, 6B persons skilled in the art will understand that any system configured to perform the method steps, in any order, is within the scope of the invention.

The method begins in step 650, where the sorting unit 624 initializes a read list structure. In one embodiment, an initialized list comprises a null list. In step 652, the sorting unit 624 receives a read request for a sector within a current DRAM page associated with the read list structure. If, in step 654, a request for an ECC sector associated with the sector is not represented in the read list structure, then the method proceeds to step 656. In step 656, the sorting unit 624 appends a read request for the ECC sector corresponding to the requested sector to the read list structure. In step 658, the sorting unit 624 appends a read request for the requested sector to the read list structure.

If, in step 660, the sorting unit 624 is done composing the read list structure, then the method terminates in step 662.

Returning to step 654, if the ECC sector corresponding to the requested sector is represented in the read list structure, then the method proceeds directly to step 658, previously described herein.

Returning to step 660, if the sorting unit 624 is not done composing the read list structure, then the method returns to step 652.

Figure 6D:
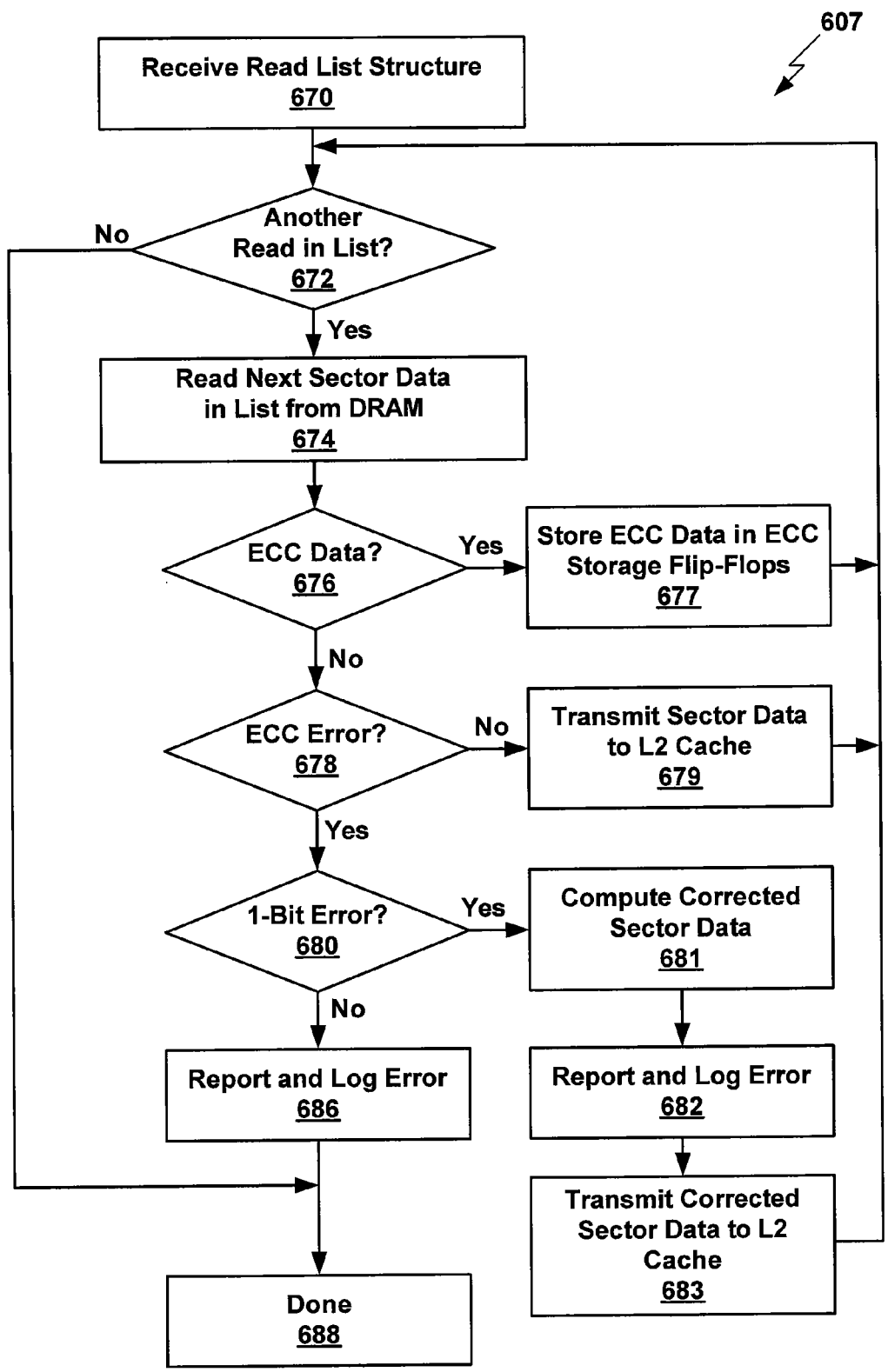
FIG. 6D is a flow diagram of method steps for reading a DRAM page, according to one embodiment of the present invention.

FIG. 6D is a flow diagram of method steps for reading a DRAM page, according to one embodiment of the present invention. Although the method steps are described in conjunction with the systems of FIGS. 1-3B, 6B persons skilled in the art will understand that any system configured to perform the method steps, in any order, is within the scope of the invention.

The method begins in step 670, where the arbitration unit 626 receives a read list structure generated in the sorting unit 624. In one embodiment, the arbitration unit 626 is configured to sequentially process the read list structure, and to sequentially transmit elements from the read list structure to the read return unit 632, which executes each read request in order of appearance within the read list structure. Alternatively, the read return unit 632 receives a plurality of elements from the read list structure for execution. If, in step 672, the read list structure includes another read request, then the method proceeds to step 674, where the read return unit 632 reads a sector of data specified in the read list structure from DRAM page 518.

If, in step 676 the sector of data is not ECC data, then the method proceeds to step 678. If, in step 678 an ECC error is detected based on the sector of data and ECC data stored in ECC storage flip-flops 634, then the method proceeds to step 680.

If, in step 680, the ECC error is a one-bit ECC error then the method proceeds to step 681, where the read return unit 632 computes corrected sector data based on the sector of data and ECC data stored in the ECC storage flip-flops 634. In step 682, read return unit 632 reports the one-bit ECC error and logs the one-bit ECC error using any technically feasible technique. In one embodiment, the read return unit 632 also reports that the corrected sector data should be marked "dirty" by the L2 cache 350, to force a write-back of the corrected sector data to the DRAM page 518. The write-back operation over-writes corrupted sector data with the corrected sector data. In step 683, the read return unit 632 transmits the corrected sector data to the L2 cache 350 for storage.

Returning to step 676, if the sector of data is ECC data, then the method proceeds to step 677, where the read return unit 632 stores the ECC data in ECC storage flip-flops 634.

Returning to step 678, no ECC error is detected, then the method proceeds to step 679, where the read return unit 632 transmits the sector data to the L2 cache 350 for storage.

Returning to step 680, if the ECC error is not a one-bit ECC error, then the method proceeds to step 686. In step 686, the read return unit 632 reports the ECC error and logs the ECC error using any technically feasible technique. In one embodiment, the read return unit 632 generates an interrupt that informs an application executing on CPU 102 of FIG. 1 that an error has occurred that is not automatically recoverable in hardware. The method terminates in step 688.

Returning to step 672, if the read list structure does not include another read request, then the method terminates in step 688.

ECC Protection of Write Path to DRAM

Figure 7A:
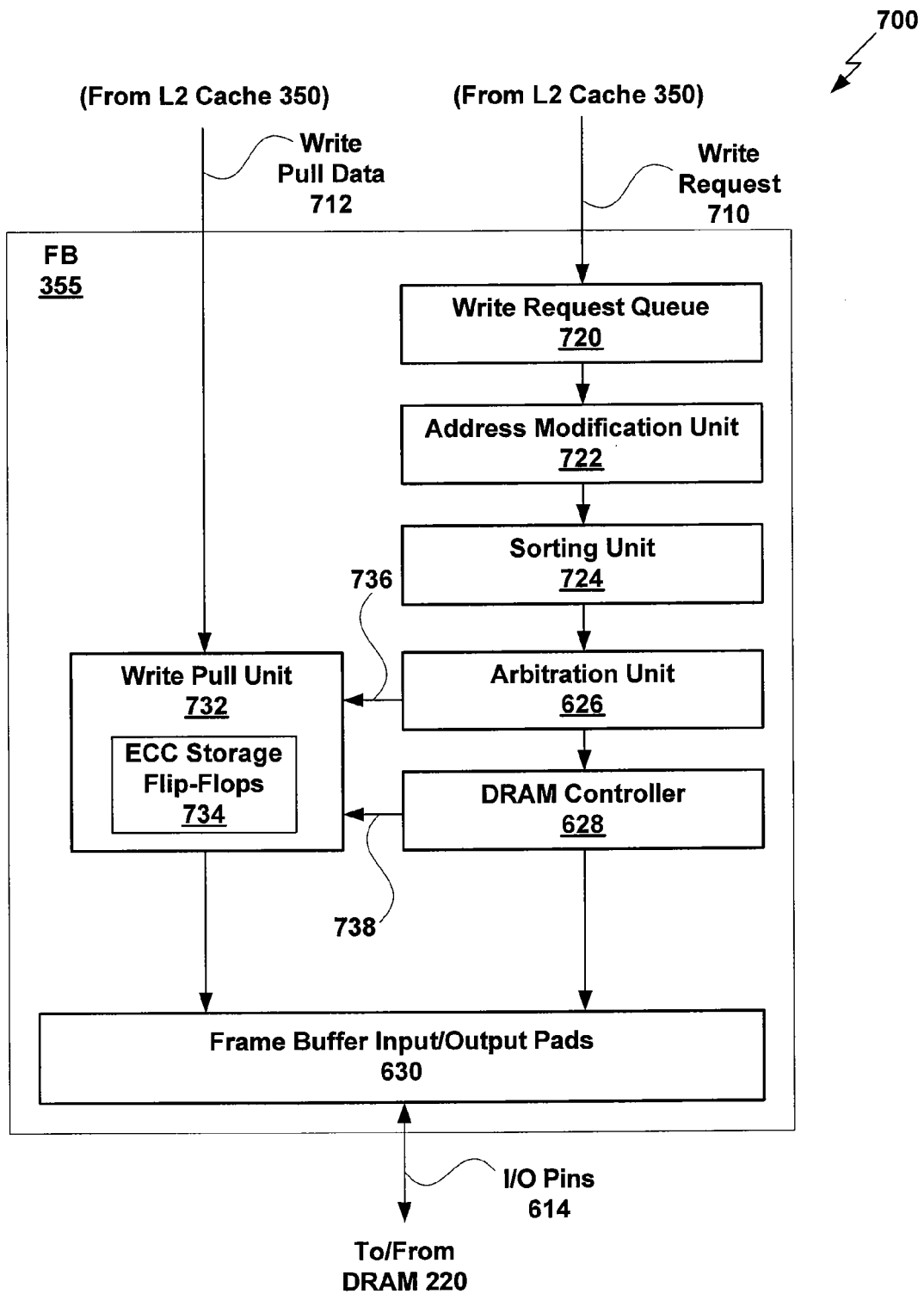
FIG. 7A is a block diagram of an ECC-protected write path from the L2 cache to the DRAM, according to one embodiment of the present invention.

FIG. 7A is a block diagram of an ECC-protected write path 700 from the L2 cache 350 to the DRAM 220, according to one embodiment of the present invention. The ECC-protected write path 700 resides within FB 355 of FIG. 3B. The ECC-protected write path 700 comprises a write request queue 720, an address modification unit 722, a sorting unit 724, an arbitration unit 626, a DRAM controller 628, frame buffer I/O pads 630, and a write pull unit 732. I/O pins 614 of FIG. 6A connect the ECC-protected write path 700 to one or more DRAM chips 220.

The write request queue 720 receives write requests from the L2 cache 350 via a write request signal 710 requesting the transmission of data stored in the cache lines within the L2 cache 350 to the DRAM 220. The write request queue 720 stores the write requests until the address modification unit 722 is ready to process the write requests. In one embodiment, the L2 cache 350 generates the write requests.

The address modification unit 722 multiplies a linear physical address associated with a write request to store a one hundred twenty eight byte sector by eight-sevenths ("8/7") to generate an expanded physical address from the linear physical address. The linear physical address assumes a contiguous physical address space for application data, whereas the expanded physical address accommodates ECC data that is stored in-line with application data. In one embodiment, the ECC data is included at a rate of one sector of ECC data per seven sectors of application data. In an alternative embodiment, the address modification unit 722 multiplies the linear physical address by sixteen-fifteenths ("16/15") to accommodate one block of one hundred twenty eight bytes of ECC data per fifteen blocks of application data in a DRAM with 2K byte pages. Programs executing in the PPU 202, which are unaware of the expanded physical address space or any in-line ECC data, generate write requests assuming a linear physical address space.

The sorting unit 724 coalesces write requests to a common DRAM page, such as DRAM page 518, so that coalesced write requests to the common DRAM page may be executed sequentially once the common DRAM page has been opened, even if the write requests are received by the write request queue 720 in a different sequence. The sorting unit 724 builds a write list structure comprising at least one coalesced write request. The sorting unit 724 may simultaneously build a plurality of write list structures. The sorting unit 724 transmits the write list structure to the arbitration unit 626 for processing. In one embodiment, the arbitration unit 626 generates sequential write requests based elements stored in the write list structure and transmits the sequential write requests to the DRAM controller 628 and the write pull unit 732 (via write list data path 736) for execution. In an alternative embodiment, the arbitration unit 626 transmits a plurality of elements from the write list structure to the write pull unit 732 via write list data path 736 for execution. The DRAM controller 628 transmits protocol control signals 738 to write pull unit 732 based on each DRAM command in progress. The protocol control signals 738 allow the write pull unit 732 to operate efficiently according to proper DRAM control protocols, without requiring the write pull unit 732 to have detailed device knowledge of each possible DRAM device that may be coupled to the FB 355. The write pull unit 732 generates electrical signals, which the frame buffer I/O pads 630 use to enable communication with external DRAM devices 220.

In response to a write request transmitted via write request signal 710, a write operation is scheduled, using write list structures, for execution by the write pull unit 732, which requests and subsequently receives data corresponding to the write request from the L2 cache 350. The requested data is transmitted from the L2 cache 350 to the write pull unit 732 via write pull data signal 712. The write pull unit 732 transmits the requested data to DRAM 220 via the frame buffer I/O pads 630. The write pull unit 732 may buffer and optionally re-sequence data prior to transmitting the data to DRAM 220. The write pull unit 732 includes ECC storage flip-flops 734, configured to store ECC bytes for a currently open DRAM page, such as DRAM page 518.

Persons skilled in the art will recognize that writing at least one sector of ECC bytes upon closing each DRAM page may be a performance burden. However, the write command latency associated with the ECC bytes may frequently be hidden by other commands needed by DRAM 220; as a result, the overall performance burden of writing ECC data in line with application data should be reduced.

Figure 7B:
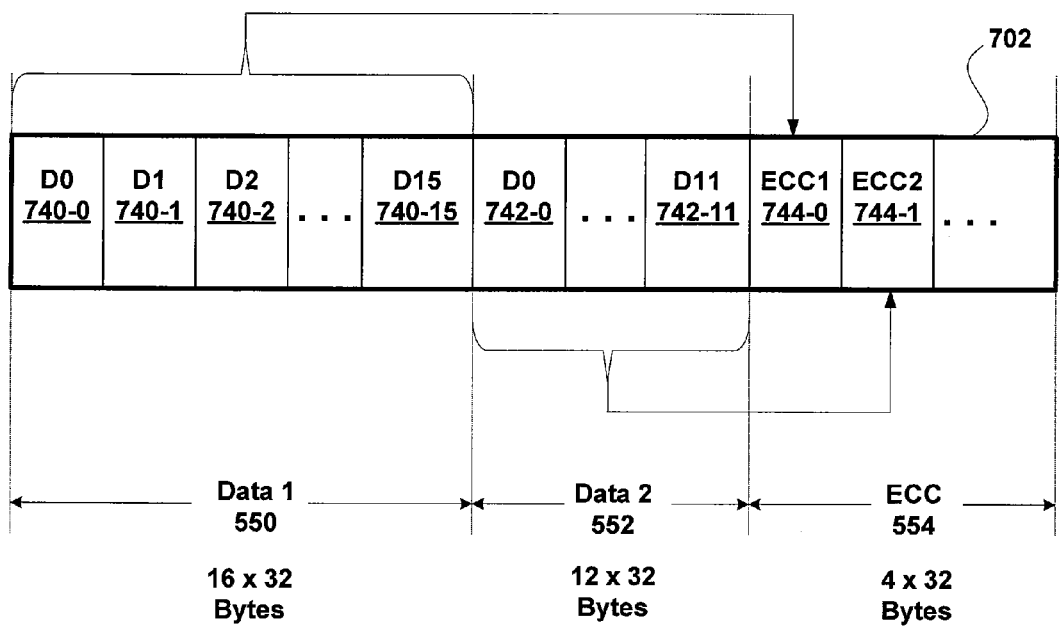
FIG. 7B illustrates a write list structure for organizing write requests to the DRAM, according to one embodiment of the present invention.

FIG. 7B illustrates a write list structure 702 for organizing write requests to the DRAM 220, according to one embodiment of the present invention. The write list structure 702 represents an ordered list of cache line writes to the same DRAM page generated by the L2 cache 350 that correspond to cache lines that need to be written to the DRAM 220. In one embodiment, each cache line comprises thirty-two bytes that map directly onto a DRAM sector. Each write operation comprises an irreducible thirty-two byte transfer operation to DRAM 220.

The write list structure 702 includes flags 740, 742, and 744 that correspond to sectors within DRAM page 518 of FIG. 5A. Flags 740-0 through 740-15 correspond directly to sectors that comprise data 1 550. Each flag 740 indicates whether a corresponding sector within data 1 550 that is associated with a cache line in L2 cache 350 needs to be written to the DRAM page 518. Flags 742-0 through 742-11 correspond directly to sectors that comprise data 2 552. Each flag 742 indicate whether a corresponding sector within data 2 552 that is associated with a cache line in L2 cache 350 needs to be written to the DRAM page 518. Flags 744 correspond to sectors comprising ECC 554. Flags ECC1 744-0 correspond to ECC data ECC1 560-0. Flags ECC2 744-1 correspond to ECC data ECC2 560-1, and so forth. The write list structure 702 is organized to include the flags 744 corresponding to sectors comprising ECC 554 last to ensure that those sectors are written only after any sectors in data 1 550 and data 2 552 are written.

When the write list structure 702 is initialized, flags 740, 742, and 744 are cleared. Each subsequent write request that is coalesced into write list structure 702 to any sector within data 1 550 sets a corresponding flag 740 and an associated flag in ECC1 744-0. Similarly, each subsequent write request that is coalesced into write list structure 702 to any sector within data 2 552, sets a corresponding flag 742 and an associated flag in ECC2 744-1. After certain conditions are met within sorting unit 724, the write list structure 702 is closed and executed by the arbitration unit 626. Additional write list structures may be generated concurrently with write list structure 702 for execution before and after write list structure 702.

The write list structure 702 specifies data to be retrieved by the write pull unit 732 from the L2 cache 350 and written to the DRAM page 518 within DRAM 220. Each flag within flags 740 and 742 invokes a corresponding thirty-two byte write operation executed by the write pull unit 732 to the DRAM page 518. Each flag within ECC1 744-0 and ECC2 744-1 invokes a thirty-two byte write operation (a minimal, irreducible input/output operation to DRAM) that generally includes per-byte write enables. For example, if only one sector within data 1 550 is written, then only one flag within ECC1 744-0 is set, indicating that exactly two bytes of ECC data from ECC1 560-0 need to be written. To preserve unwritten ECC data bytes within ECC1 560-0, only the two bytes of ECC data are enabled for writing when sector ECC1 560-0 is written. Flags 740 and 742 correspond directly to flags 744-0 and 744-1, respectively. In one embodiment, flags 740 and 742 are stored within the sorting unit 724 and transferred to the arbitration unit 626; however, flags 744 need not be separately stored in the sorting unit 724 or arbitration unit 626. Instead, flags 744 may be accumulated within the write pull unit 732 as write requests are posted to the pull unit 732 from the arbitration unit 626 for a common DRAM page 518. After a final write request associated with data 1 550 and data 2 552 is posted to the DRAM page 518, the write pull unit 732 generates one or two additional write requests to ECC sectors 560. If any writes to data 1 550 were performed, then accumulated flags 774-0 are used as byte enables when writing ECC bytes from ECC storage flip-flops 734 to ECC1 560-0. If any writes to data 2 552 were performed, then accumulated flags 774-1 are used as byte enables when writing ECC bytes from ECC storage flip-flops 734 to ECC2 560-1.

In an alternative embodiment, a read-modify-write operation is performed on ECC sectors 560, where a complete write (all byte enables set true) is performed to ECC sectors 560 using a version of ECC sectors 560 modified to reflect writes made to the DRAM page 518.

Figure 7C:
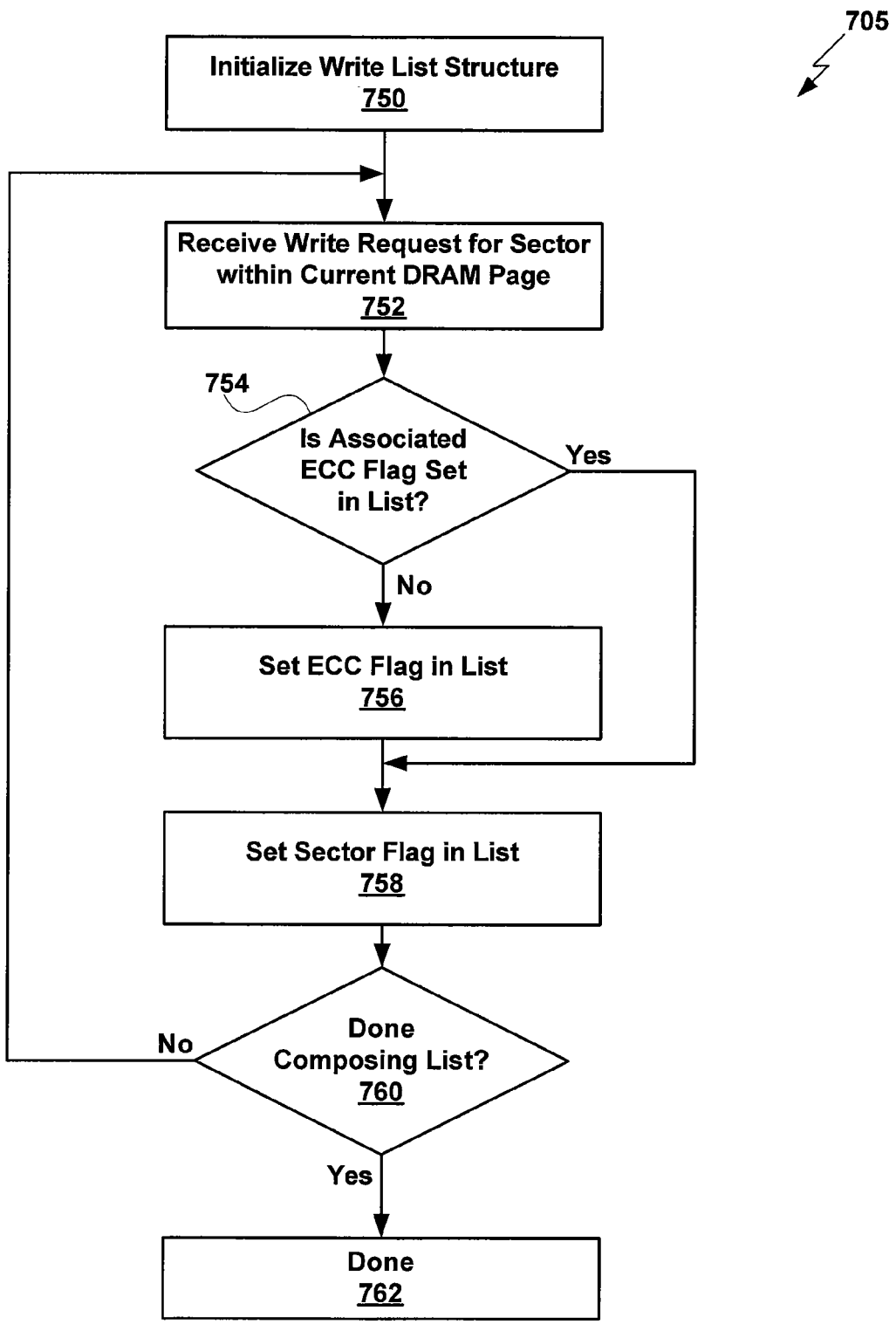
FIG. 7C is a flow diagram of method steps for composing the write list structure, according to one embodiment of the present invention.

FIG. 7C is a flow diagram of method steps 705 for composing the write list structure, according to one embodiment of the present invention. Although the method steps are described in conjunction with the systems of FIGS. 1-3B, 7B persons skilled in the art will understand that any system configured to perform the method steps, in any order, is within the scope of the invention.

The method begins in step 750, where the sorting unit 724 initializes a write list structure associated with DRAM page 518. Again, when the write list structure is initialized, flags corresponding to sectors within the DRAM page 518 are cleared. In step 752 the sorting unit 724 receives a write request corresponding to a sector within DRAM page 518.

If, in step 754, an ECC flag associated with the sector in the DRAM page 518 corresponding to the write request is not set within the write list structure then the method proceeds to step 756. In step 756 the sorting unit 724 sets the associated ECC flag in the write list structure. In step 758 the sorting unit 724 sets a flag within the write list structure corresponding to the sector associated with the sector in the DRAM page 518 corresponding to the write request.

If, in step 760 the sorting unit 724 is done composing the write list structure, then the method terminates in step 762. However, if the sorting unit is not done composing the write list structure, then the method returns to step 752.

Returning to step 754, if the ECC flag corresponding to the write request is set within the write list structure, then the method proceeds to step 758, previously described herein.

Figure 7D:
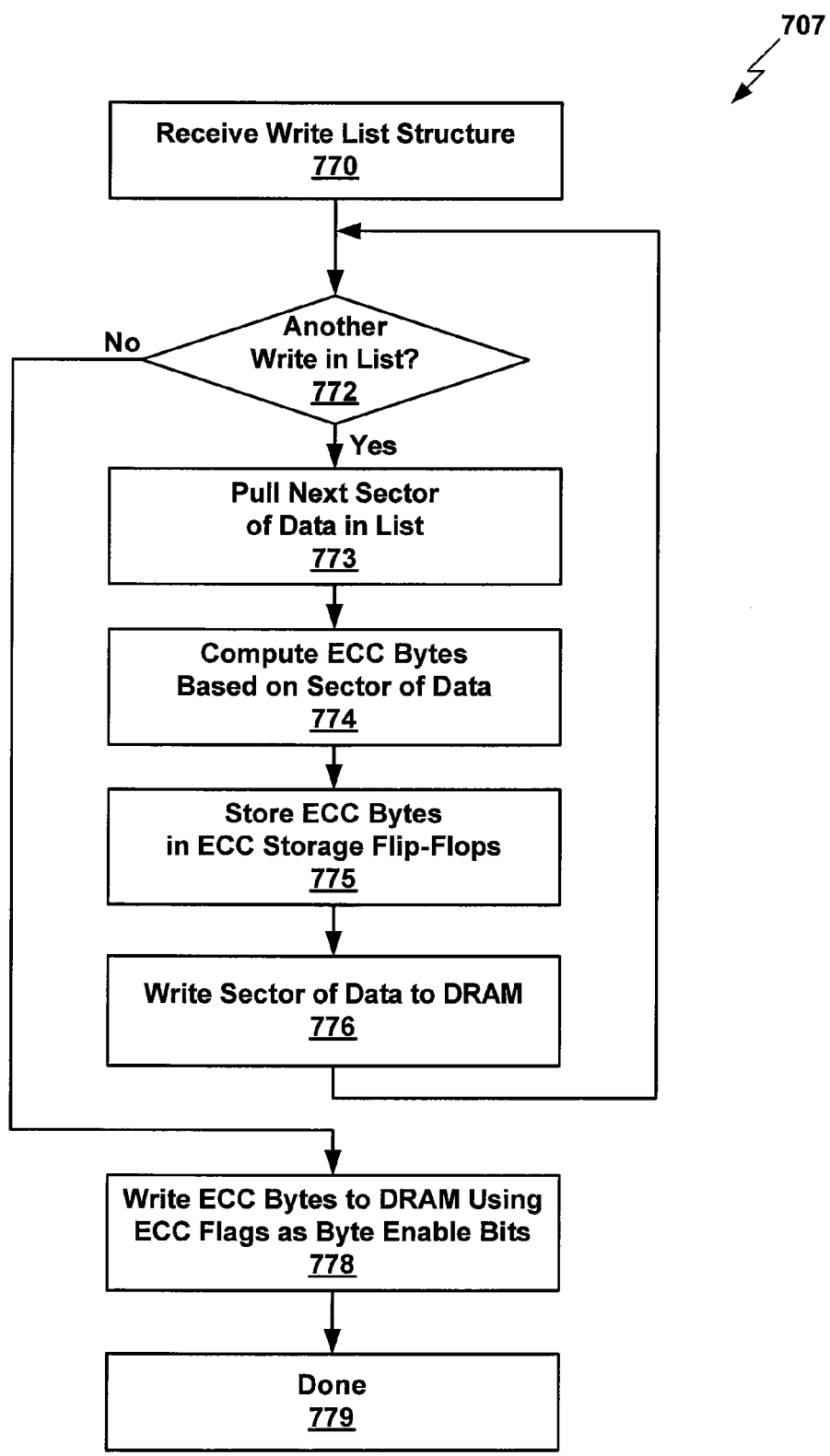
FIG. 7D is a flow diagram of method steps for writing a DRAM page using byte enables to selectively write related ECC data, according to one embodiment of the present invention.

FIG. 7D is a flow diagram of method steps 707 for writing a DRAM page 518 using byte enables to selectively write related ECC data, according to one embodiment of the present invention. Although the method steps are described in conjunction with the systems of FIGS. 1-3B, 7B persons skilled in the art will understand that any system configured to perform the method steps, in any order, is within the scope of the invention.

The method begins in step 770, where the arbitration unit 626 receives a write list structure generated in sorting unit 724. In one embodiment, the arbitration unit 626 is configured to sequentially process the write list structure, and to sequentially transmit elements from the write list structure to the write pull unit 732 for execution. Alternatively, the write pull unit 732 receives a plurality of elements from the write list structure for execution. If, in step 772, another write request associated with a sector of data is included in the write list structure, then the method proceeds to step 773. In step 773, the write pull unit 732 pulls the sector of data associated with the write request from L2 cache 350. In step 774, the write pull unit 732 computes ECC bytes associated with the sector of data. In step 775, the write pull unit 732 stores the ECC bytes associated with the sector of data in ECC storage flip-flops 734. In step 776, the write pull unit 732 writes the sector of data to the DRAM page 518 in DRAM 220.

Returning to step 772, if another write request is not included in the write list structure, then the method proceeds to step 778. In step 778, the write pull unit 732 writes the ECC bytes stored in ECC storage flip-flops 734 to DRAM page 518, using ECC flag bits as byte enables for performing selective writes of the ECC data. Only ECC bytes that are currently available and stored within the ECC storage flip-flops 734 are written to the DRAM page 518. Up to two sectors of ECC bytes may be written for DRAM configurations comprising 1K byte pages. Up to four sectors of ECC bytes may be written for DRAM configurations comprising 2K byte pages. The method then terminates in step 779.

Figure 7E:
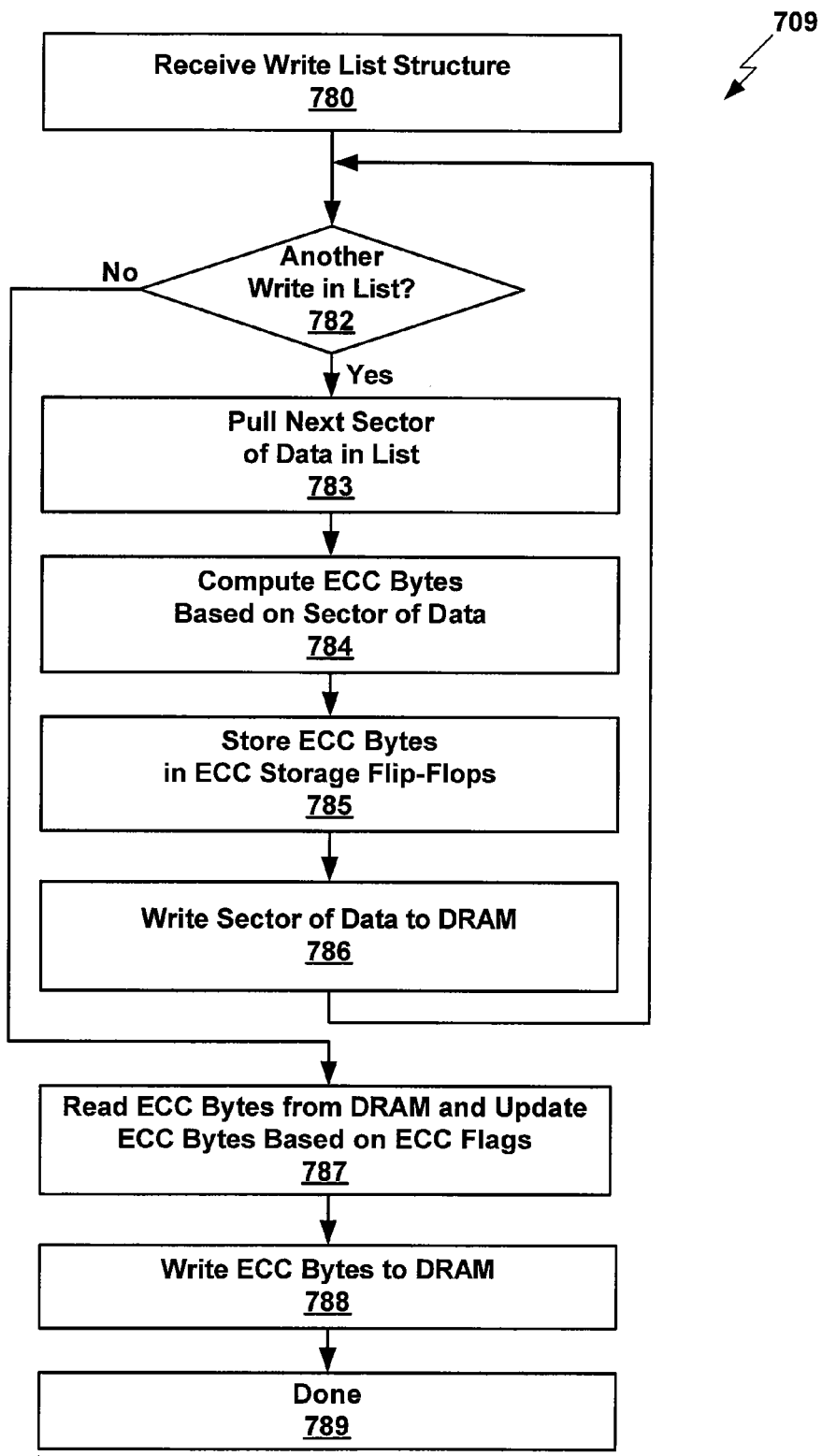
FIG. 7E is a flow diagram of method steps for writing a DRAM page using a read-modify-write approach to selectively write related ECC data, according to one embodiment of the present invention.

FIG. 7E is a flow diagram of method steps for writing a DRAM page using a read-modify-write approach to selectively write related ECC data, according to one embodiment of the present invention. Although the method steps are described in conjunction with the systems of FIGS. 1-3B, 7B persons skilled in the art will understand that any system configured to perform the method steps, in any order, is within the scope of the invention.

The method begins in step 780, where the arbitration unit 626 receives a write list structure generated by the sorting unit 724. If, in step 782, another write request associated with a sector of data is included in the write list structure, then the method proceeds to step 783. In step 783, the write pull unit 732 pulls the sector of data associated with the write request from L2 cache 350. In step 784, the write pull unit 732 computes ECC bytes associated with the sector of data. In step 785, the write pull unit 732 stores the ECC bytes associated with the sector of data in the ECC storage flip-flops 734. In step 786, the write pull unit 732 writes the sector data to the DRAM page 518 in DRAM 220.

Returning to step 782, if another write request is not included in the write list structure, then the method proceeds to step 787. In step 787, the write pull unit 732 triggers a read of ECC bytes stored in the ECC data 554 from DRAM page 518 and updates the ECC bytes based on ECC flags from the write list structure. Importantly, all ECC bytes for each updated ECC sector 560 are available at this point within the ECC storage flip-flops 734.

In step 788, the write pull unit 732 writes ECC bytes stored in ECC storage flip-flops 734 to the ECC data 554 in the DRAM page 518. Up to two sectors of ECC bytes may be written for DRAM configurations comprising 1K byte pages. Up to four sectors of ECC bytes may be written for DRAM configurations comprising 2K byte pages. The method terminates in step 789.

In sum, a technique for adding ECC capability to existing DRAM configurations for parallel processing subsystem 112 of FIG. 1 is disclosed. ECC data is added in-line with application data, eliminating a need for additional DRAM components conventionally required for ECC protection of external memory. The ECC data is allocated within a DRAM page of related, protected application data. By transforming physical addresses to conceal the ECC data, the parallel processing subsystem 112 can operate in a transparent ECC mode. Because ECC mode is essentially transparent, the parallel processing subsystem 112 can also operate in a non-ECC mode without loss of efficiency. Read requests to DRAM operating in ECC mode are coalesced into ordered read lists according to DRAM page affiliation, with preference given in the list order to pre-loading ECC data for a given page. Write requests to DRAM operating in ECC mode are coalesced into ordered write lists, also according to DRAM page affiliation, with ECC data written last for a set of write operations to a given DRAM page. When a correctable error is encountered, read logic corrects the error and stores a corrected version in an L2 cache line. In one embodiment, the cache line is also marked "dirty," which forces a write back into DRAM of the corrected data.

One advantage of the present invention is that a common hardware configuration of the parallel processing subsystem 112 can operate in both ECC mode for higher computational integrity and non-ECC mode for higher performance, without conventional cost burdens associated with operating a processor system in ECC mode. Specifically, the present invention enables a processing system to beneficially operate in ECC mode without additional DRAM devices or I/O pins. An additional benefit of the present invention is that ECC mode is essentially transparent to applications executing on the parallel processing subsystem 112.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

We claim:

1. A method for accessing a memory unit, the method comprising:
receiving a first data access request associated with a first data sector included in a page within the memory unit, a second data access request associated with a second data sector included in the page, and an error correction code (ECC) access request associated with an ECC sector corresponding to the first data sector and the second data sector;
accessing the first data sector to process the first data access request;
accessing the second data sector to process the second data access request; and
accessing the ECC sector only once when performing an operation on ECC data stored in the ECC sector, wherein the ECC data corresponds to data associated with the first data access request and data associated with the second data access request.

2. The method of claim 1, wherein the first data access request comprises a first read request, and the second data access request comprises a second read request, accessing the first data sector comprises retrieving the data associated with the first read request, and accessing the second data sector comprises retrieving the data associated with the second read request, and accessing the ECC sector comprises retrieving the ECC data stored in the ECC sector.

3. The method of claim 1, further comprising determining whether an ECC error exists based on the data associated with the first read request and the ECC data.

4. The method of claim 3, further comprising, when an ECC error does not exist, transmitting the data associated with the first read request to a client that transmitted the first read request.

5. The method of claim 3, wherein the ECC error comprises a 1-bit error, and further comprising, when the 1-bit error does exist, correcting the 1-bit error and transmitting the corrected data associated with the first read request to a client that transmitted the first read request.

6. The method of claim 3, further comprising, when the ECC error does exist, reporting the ECC error to a client that transmitted the first read request.

7. The method of claim 1, wherein the first data access request comprises a first write request, and the second data access request comprises a second write request, accessing the first data sector comprises writing the data associated with the first write request to the first data sector, and accessing the second data sector comprises writing the data associated with the second read request to the second data sector.

8. The method of claim 7, further comprising computing the ECC data corresponding to the data associated with the first write request and the data associated with the second write request.

9. The method of claim 8, further comprising storing the ECC data in on-chip ECC storage until the data associated with the first write request is written to the first data sector and data associated with the second write request is written to the second data sector.

10. The method of claim 9, wherein accessing the ECC sector comprises writing the ECC data stored in the on-chip ECC storage to the ECC sector after the data associated with the first write request is written to the first data sector and data associated with the second write request is written to the second data sector.

11. A memory controller configured to check data stored in a memory unit for errors, the memory controller configured to:
receive a first data access request associated with a first data sector included in a page within the memory unit, and an error correction code (ECC) access request associated with an ECC sector corresponding to the first data sector;
access the first data sector to process the first data access request; and
access the ECC sector only once when performing an operation on ECC data stored in the ECC sector, wherein the ECC data corresponds to data associated with the first data access request.

12. The memory controller of claim 11, wherein the first data access request comprises a first read request, accessing the first data sector comprises retrieving the data associated with the first read request, and accessing the ECC sector comprises retrieving the ECC data stored in the ECC sector.

13. The memory controller of claim 11, further comprising determining whether an ECC error exists based on the data associated with the first read request and the ECC data.

14. The memory controller of claim 13, further comprising, when an ECC error does not exist, transmitting the data associated with the first read request to a client that transmitted the first read request.

15. The memory controller of claim 13, wherein the ECC error comprises a 1-bit error, and further comprising, when the 1-bit error does exist, correcting the 1-bit error and transmitting the corrected data associated with the first read request to a client that transmitted the first read request.

16. The memory controller of claim 13, further comprising, when the ECC error does exist, reporting the ECC error to a client that transmitted the first read request.

17. The memory controller of claim 11, wherein the first data access request comprises a first write request, and accessing the first data sector comprises writing the data associated with the first write request to the first data sector.

18. The memory controller of claim 17, further comprising computing the ECC data corresponding to the data associated with the first write request.

19. The memory controller of claim 18, further comprising storing the ECC data in on-chip ECC storage until the data associated with the first write request is written to the first data sector.

20. A computing device, comprising:

a memory; and a parallel processor unit coupled to the memory and including at least one memory controller that is configured to:
  receive an access list data structure corresponding to a page within the memory unit, wherein the access list data structure includes a first data access request associated with a first data sector included in the page, a second data access request associated with a second data sector included in the page, and an error correction code (ECC) access request associated with an ECC sector corresponding to the first data sector and the second data sector,
  access the first data sector to process the first data access request; and
  access the second data sector to process the second data access request, and
  access the ECC sector when performing an operation on ECC data stored in the ECC sector, wherein the ECC data corresponds to data associated with the first data access request and data associated with the second data access request.

* * * * *

UNITED STATES PATENT AND TRADEMARK OFFICE
CERTIFICATE OF CORRECTION

PATENT NO. : 9,490,847 B2  
APPLICATION NO. : 13/660737  
DATED : November 8, 2016  
INVENTOR(S) : Fred Gruner et al.

Page 1 of 1

It is certified that error appears in the above-identified patent and that said Letters Patent is hereby corrected as shown below:

In the Claims

Column 22, Claim 20, Line 3, please delete "unit".

Signed and Sealed this
Fourteenth Day of March, 2017

Michelle K. Lee
*Director of the United States Patent and Trademark Office*